United States Patent [19]
Miyake et al.

[11] Patent Number: 5,912,694
[45] Date of Patent: Jun. 15, 1999

[54] LASER DIODE DRIVING CIRCUIT, SEMICONDUCTOR INTEGRATED CIRCUIT FOR DRIVING LASER DIODE, AND IMAGE RECORDING APPARATUS

[75] Inventors: Hiroyuki Miyake; Chikaho Ikeda, both of Nakai-machi, Japan

[73] Assignee: Fuji Xerox Co., Ltd., Tokyo, Japan

[21] Appl. No.: 08/923,968

[22] Filed: Sep. 5, 1997

[30] Foreign Application Priority Data

Sep. 10, 1996 [JP] Japan ..................... 8-239040

[51] Int. Cl.⁶ .............. H01S 3/00; H01S 3/096; B41J 2/47
[52] U.S. Cl. .............. 347/247; 372/29; 372/38; 347/129; 347/133
[58] Field of Search ......... 372/38, 29; 347/129, 347/133, 247

[56] References Cited

U.S. PATENT DOCUMENTS

| | | | |
|---|---|---|---|
| 5,463,410 | 10/1995 | Uchiyama | 347/133 |
| 5,521,933 | 5/1996 | Sosa | 372/38 |
| 5,651,017 | 7/1997 | Genovese | 372/38 |
| 5,661,739 | 8/1997 | Ohashi | 372/38 |
| 5,675,599 | 10/1997 | Abe et al. | 372/38 |
| 5,677,723 | 10/1997 | Soya et al. | 347/247 |
| 5,748,657 | 5/1998 | Gaddis | 372/38 |
| 5,818,503 | 10/1998 | Kusano et al. | 347/247 |

FOREIGN PATENT DOCUMENTS

A 6-334248  12/1994  Japan.

*Primary Examiner*—James W. Davie
*Assistant Examiner*—Sung T. Kim
*Attorney, Agent, or Firm*—Oliff & Berridge, PLC

[57] ABSTRACT

The present invention relates to a laser diode driving circuit for supplying a drive current to a laser diode, a semiconductor integrated circuit for driving the laser diode, and an image recording apparatus in which a step of executing a scanning on a predetermined member to be scanned with a laser beam holding image information is included in an image recording step. The laser diode is certainly kept in a no light emitting state at a timing when the laser diode should be kept in the no light emitting state and is allowed to emit a laser beam of the light quantity faithfully corresponding to the drive current at a timing when the drive current is supplied to the laser diode. A bias current out of the bias current and a drive current which are supplied to a laser diode 1 is further divided into a first bias current and a second bias current. Normally, only the first bias current is supplied to the laser diode. The second bias current is supplied and stopped in a manner similar to the drive current.

6 Claims, 8 Drawing Sheets

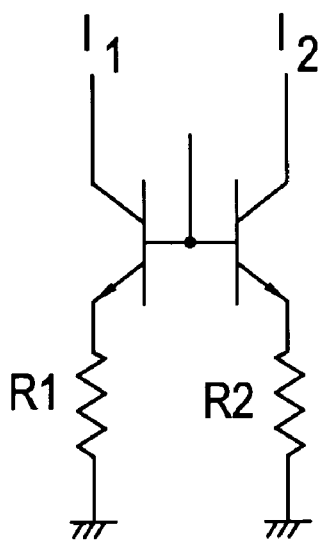
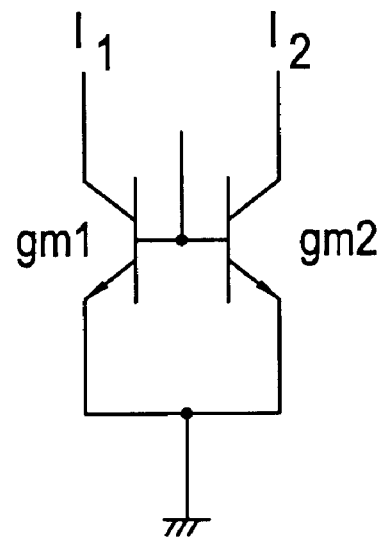
Fig. 4(a)   Fig. 4(b)
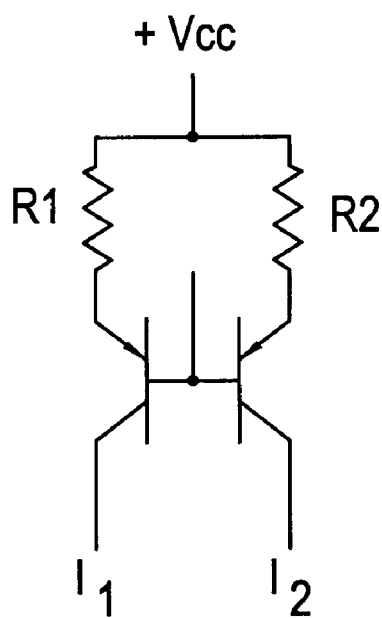
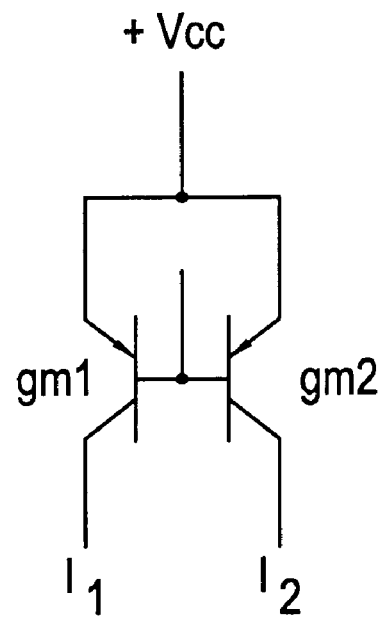
Fig. 4(c)   Fig. 4(d)

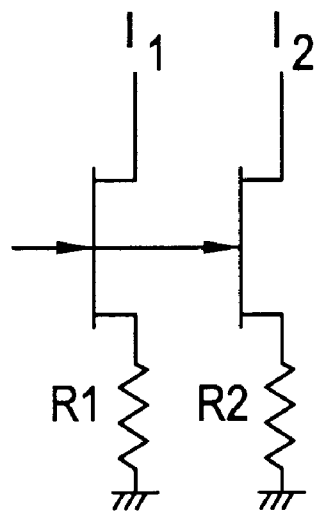
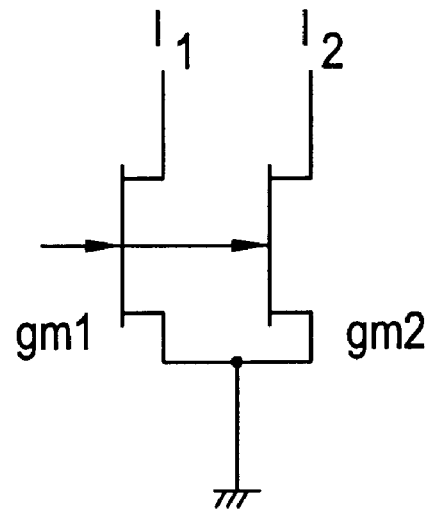
Fig. 5(a)　　　Fig. 5(b)
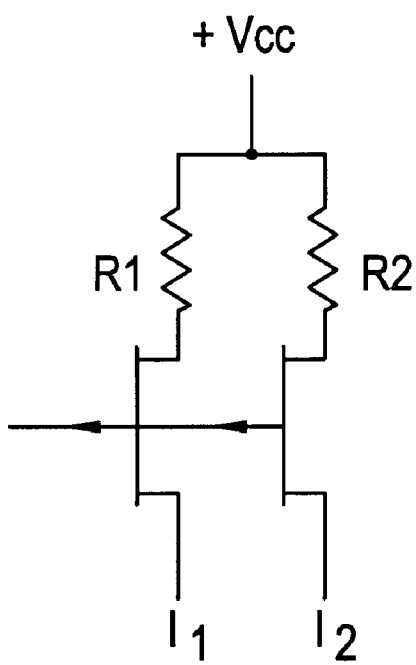
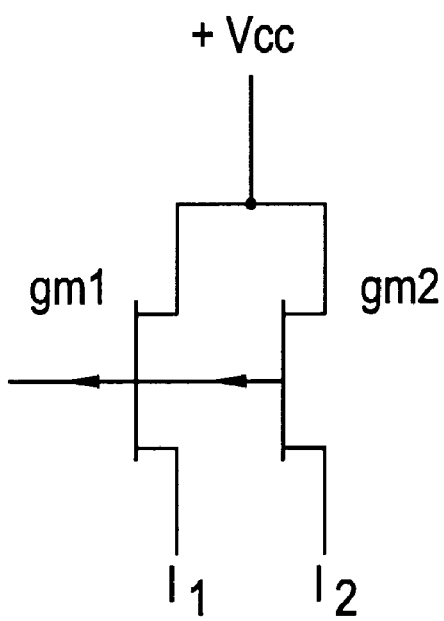
Fig. 5(c)　　　Fig. 5(d)

he laser beam of the light quantity proportional to the current portion exceeding the threshold current $I_{th}$ in the current supplied to the laser diode 107 is emitted. The laser beam emitted from the laser diode 107 is reflected and deflected by a polygon mirror 108 and a photosensitive member 109 on which an electrostatic latent image is formed is scanned by the irradiation of the laser beam, thereby forming an electrostatic latent image on the photosensitive member 109. The electrostatic latent image formed on the photosensitive member 109 is developed by toner in accordance with a known electrophotographic process and the toner image is transferred and fixed on a sheet.

LASER DIODE DRIVING CIRCUIT, SEMICONDUCTOR INTEGRATED CIRCUIT FOR DRIVING LASER DIODE, AND IMAGE RECORDING APPARATUS

BACKGROUND OF THE INVENTION

1. Field of Invention

The present invention relates to a laser diode driving circuit for supplying a drive current to a laser diode, a semiconductor integrated circuit for driving the laser diode, and an image recording apparatus in which a step of executing a scanning on a predetermined member to be scanned with a laser beam holding image information is included in an image recording step.

2. Description of Related Art

A laser diode is conventionally used as a means for generating a light beam in an image recording device.

FIG. 8 is a diagram showing the light output characteristic of a laser diode. The axis of abscissa denotes currents supplied to the laser diode and the axis of ordinate shows a light output power for the current supplied.

As shown in the diagram, the light output characteristic of the laser diode is divided into an LED region when a current supplied to the laser diode is less than a predetermined light emission threshold current $I_{th}$ and a laser beam emission region when the supplied current is equal to or larger than the light emission threshold current $I_{th}$. In the LED region, light is not substantially emitted from the laser diode. In the laser beam emission region, the light output of the power almost proportional to a drive current obtained by subtracting the light emission threshold current $I_{th}$ from the supply current can be obtained. Consequently, when the laser diode is driven so as to repeatedly emit lights and stop the emission at high speed, it is necessary to always flow a bias current which is almost equal to the light emission threshold current $I_{th}$ to the laser diode even at the time of no light emission.

As methods of obtaining half-tone by an image recording apparatus using the laser diode, there are a pulse width modulating method and a luminous intensity modulating method. The pulse width modulating method changes the exposure per pixel by changing the pulse width in accordance with image information. The luminous intensity modulating method changes the exposure per pixel by changing the power of the laser in accordance with image information. In the case of the pulse width modulating method, the processing speed of allowing the laser diode to emit light and to stop the emission is limited. When the high processing speed is intended to be achieved, either the luminous intensity modulating method or a modulating method in which the pulse width modulating method is combined with the luminous intensity modulating method can be considered.

FIG. 9 is a schematic diagram mainly showing a laser diode driving circuit part of a conventional image recording apparatus using the luminous intensity modulating method (refer to Published Unexamined Japanese Patent Application No. Hei 6-334248).

From a signal generating circuit 101, a digital image signal is outputted synchronously with a timing signal generated by a timing signal generating circuit 102, passed through a digital adder 103, converted by a D/A converter 104 into an analog image signal, passed through an aenalog adder 105, and amplified by a drive amplifying circuit 106 to drive a laser diode 107, and a current is supplied to the laser diode 107. As described with reference to FIG. 8, the laser beam reflected and deflected by the polygon mirror 108 is detected by a photodetector 110 at scan start timings and the scan start timings are notified to the timing signal generating circuit 102. The timing generating circuit 102 receives the scan start timing signals and controls all of an output timing of the digital image signal outputted from the signal generating circuit 101, timings to read the maximum and minimum from a maximum and minimum generating memory 113, and sample and hold timings of two sample and hold circuits 114 and 115.

The maximum and minimum image signals are stored in the maximum and minimum generating memory 113 and are sequentially read out at timings when the laser beam emitted from the laser diode 107 and reflected and deflected by the polygon mirror 108 is deviated from the photosensitive member 109 and when there is no signal generated from the signal generating circuit 101 (the value "0" is outputted). The signals are supplied to the digital adder 103, D/A converter 104, analog adder 105, and drive amplifying circuit 106, and the currents corresponding to the maximum and minimum are supplied to the laser diode 107.

A part of the laser beam emitted from the laser diode 107 is received by a photodiode 111 and is converted into a voltage signal by an I/V converter 112 for converting current signals to voltage signals, and the resultant data is transmitted to the two sample and hold circuits 114 and 115. On the basis of the timing signals from the timing signal generating circuit 102, the sample and hold circuits 114 and 115 sample and hold the signals supplied from the I/V converter 112 at time points when the laser beams of the light quantities corresponding to the maximum and minimum read out from the maximum and minimum generating memory 113 are emitted from the laser diode 107, respectively, and supply the signals to comparing circuits 116 and 117. The comparing circuit 116 compares the supplied sampled and held signal corresponding to the maximum with a predetermined maximum signal Pmax, supplies the resultant data as a reference voltage of the D/A converter 104 to the D/A converter 104, and the scale of the D/A conversion is adjusted on the basis of the data. The comparing circuit 117 compares the sampled and held signal corresponding to the minimum with a predetermined minimum signal Pmin, supplies the resultant data as a bias voltage to the analog adder 105, and the bias of the whole signals supplied to the drive amplifying circuit 106 is adjusted on the basis of the data.

In the conventional technique shown in FIG. 9, the laser diode 107 is driven by the current signals in which the scale and the bias are adjusted and the luminous intensity is modulated as mentioned above.

According to the conventional technique, however, the current signal at the minimum level corresponding to the bias current is the minimum value in the signal level at which the latent image is formed on the photosensitive member 109, in other words, it is a minimum value Imin determined in the laser beam emission region shown in FIG. 8. When the current of the minimum value Imin is supplied to the laser diode 107, there is the possibility that, although it is weak, the laser diode 107 emits a light, so that an offset or fog occurs in the latent image formed on the photosensitive member 109, and a preferable reproduction image cannot be obtained.

SUMMARY OF THE INVENTION

In consideration of the above circumstances, it is an object of the invention to provide: a laser diode driving circuit which can be certainly kept in a no light emitting state at a timing when the laser diode should be kept in the no light emitting state and can emit a laser beam of a light quantity faithfully corresponding to a drive current at a timing when the drive current is supplied to the laser diode; a semiconductor integrated circuit for driving the laser diode; and an image forming apparatus having functions of certainly keeping a no light emitting state of the laser diode at the timing when the laser diode should be kept in the no light emitting state and allowing the laser diode to emit a laser beam of a light quantity faithfully corresponding to an image signal.

The object is achieved by a laser diode driving circuit of the invention which supplies a bias current and a drive current to the laser diode, comprising:

(1-1) a first bias current source for supplying a first bias current which is set to a current value less than a light emission threshold of the laser diode to the laser diode;

(1-2) a second bias current source for supplying a second bias current which is the difference between a total bias current and the first bias current so that, when a current obtained by adding a drive current to the total bias current derived by adding the second bias current to the first bias current is supplied to the laser diode, the laser beam of the light quantity according to the drive current is emitted from the laser diode;

(1-3) a drive current source for supplying the drive current to the laser diode; and (1-4) a current supply control circuit which supplies the first bias current to the laser diode irrespective of whether the laser diode is allowed to emit lights or not, and in a state where the first bias current is supplied, either supplies both of the second bias current and the drive current to the laser diode or stops the supply of both of the second bias current and the drive current to the laser diode according to whether the laser diode is allowed to emit a light or not.

In the laser diode driving circuit of the invention, it is preferable that the first bias current source in (1-1), the second bias current source in (1-2), and the drive current source in (1-3) are constant current sources.

In the laser diode driving circuit of the invention, it is preferable that the first bias current source in (1-1) and the second bias current source in (1-2) are determined so that the first bias current is larger than the second bias current.

The laser diode driving circuit of the invention which supplies the bias current and the driving current to the laser diode can be also expressed as a laser diode driving circuit having:

(2-1) a plurality of bias current sources for supplying bias currents to the laser diode so that when a current obtained by adding the drive current to a total bias current is supplied to the laser diode, a laser beam of the light quantity according to the drive current can be radiated;

(2-2) a drive current source for supplying the drive current to the laser diode; and (2-3) a switching circuit which is arranged between the laser diode and both of the bias current source as a part of the plurality of bias current sources and the drive current source, and simultaneously connects or disconnects the laser diode to the part of the bias current sources and the drive current source.

In the invention, the bias current out of the bias and the drive currents supplied to the laser diode is further divided into the first and second bias currents and, normally, only the first bias current is supplied to the laser diode, and the second bias current is either supplied or stopped in a manner similar to the drive current. Consequently, when the drive current is not supplied, that is, when it is desired to keep the laser diode in state where no light is emitted, the supply of the second bias current as a part of the bias currents is also stopped, so that the laser diode can be certainly kept in the no light emitting state. When the drive current is supplied to the laser diode, the second bias current is also simultaneously supplied. Thus, the laser beam of the light quantity according to the drive current can be radiated from the laser diode.

According to the invention, when it is set so that the first bias current is larger than the second bias current, the second bias current which is supplied or stopped in a manner similar to the drive current can be small, so that the laser diode can be consequently driven at higher speed.

BRIEF DESCRIPTION OF THE DRAWINGS

FIGS. 4(*a*) to 4(*d*) are a circuit diagram showing examples of constant current sources using bipolar transistors;

FIGS. 5(*a*) to 5(*d*) are a circuit diagram showing examples of constant current sources using junction transistors;

DETAILED DESCRIPTION OF PREFERRED EMBODIMENTS

Embodiments of the invention will be described hereinbelow.

Figure 1:
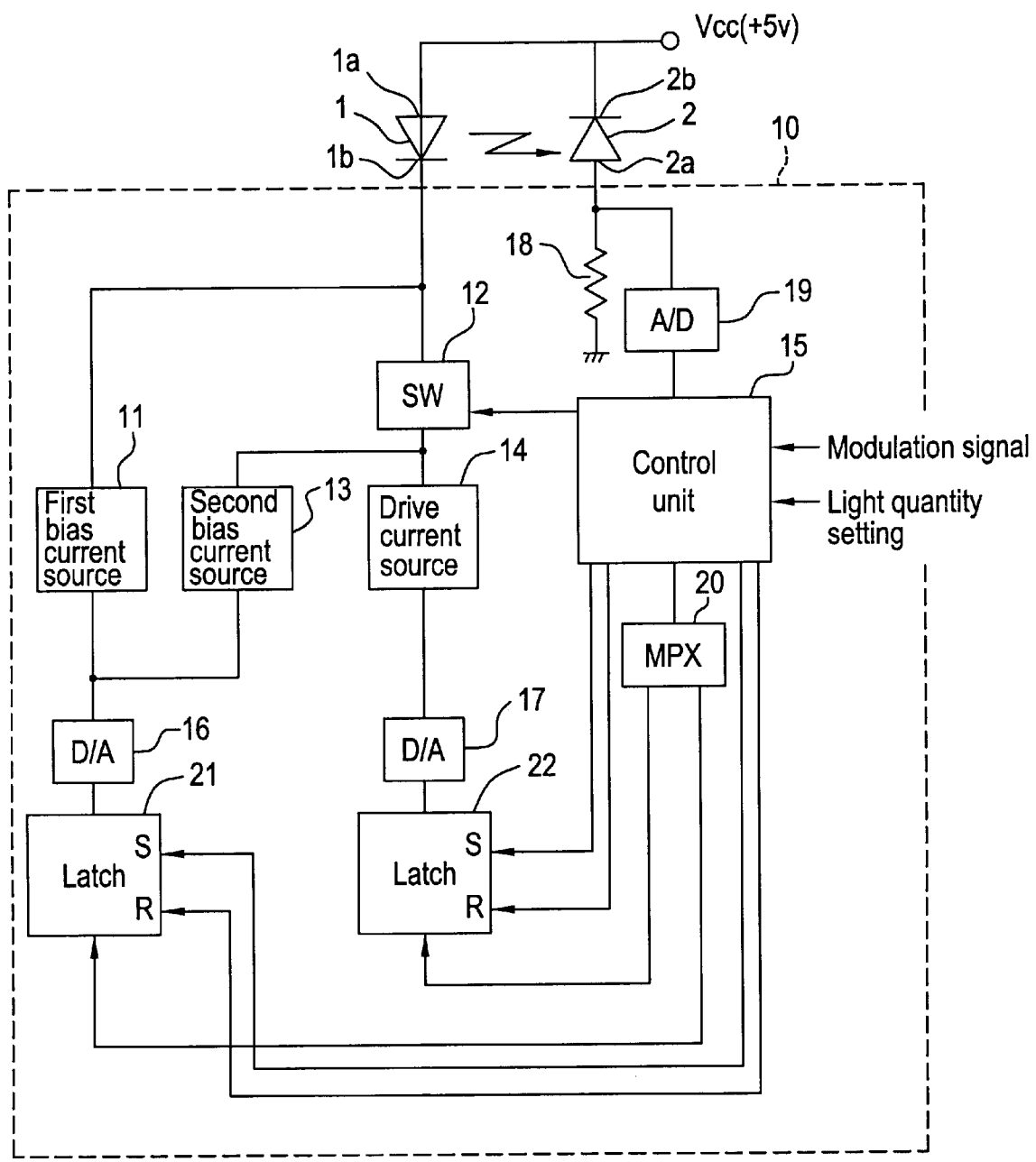
FIG. 1 is a circuit construction diagram illustrating an embodiment of a laser diode driving circuit according to the invention.

FIG. 1 is a circuit construction diagram showing an embodiment of a laser diode driving circuit of the invention.

The whole laser diode driving circuit 10 is constructed by a semiconductor integrated circuit. A laser diode 1 shown in FIG. 1 has an anode 1*a* connected to a power source $V_{cc}$ (+5V) and a cathode 1*b* directly connected to a first bias current source 11 and further connected to a second bias current source 13 and a drive current source 14 for luminous intensity modulation via a current switch 12. The current switch 12 is switched by control signals from a control unit 15. The first and second bias current sources 11 and 13 are controlled by a commonly connected first D/A converter 16. That is, an analog voltage according to a digital signal supplied to the D/A converter 16 is outputted from the D/A converter 16 and serves as a control signal for controlling a current value flowing in the first and second bias current sources 11 and 13.

Figure 2:
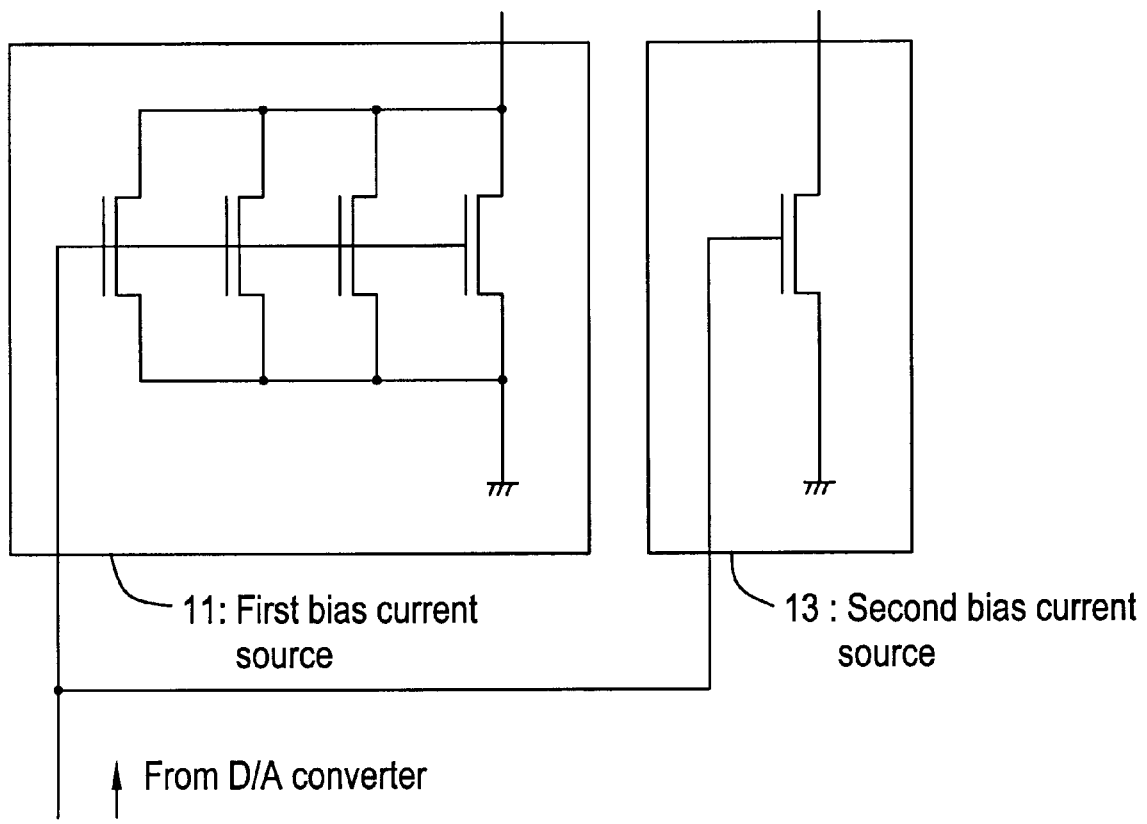
FIG. 2 is a diagram showing the circuit construction of first and second bias current sources shown in FIG. 1.

FIG. 2 is a circuit construction diagram of the first and second bias current sources shown in FIG. 1.

The first and second bias current sources 11 and 13 are constructed by, for example, MOS transistors as shown in FIG. 2. The current value across the source and the drain is controlled by the analog voltage supplied to the gate.

According to the example shown in FIG. 2, four MOS transistors having the same characteristics as those of the MOS transistor of the second bias current source 13 are connected in parallel in the first bias current source 11. When the four MOS transistors having the same characteristics are connected in parallel as mentioned above, the ratio of a first bias current flowing in the first bias current source 11 to a second bias current flowing in the second bias current source 13 is 4:1. By changing the number of the connected MOS transistors in parallel in the first and second bias current sources 11 and 13, the ratio of the first bias current to the second bias current can be set as desired. For example, when the ratio of the numbers of connected MOS transistors is 7:2, the ratio of the first bias current to the second bias current is 7:2.

The ratio of the bias currents can be also determined by, in addition to the above example, a method of changing the channel width of the MOS transistor. When the channel width of the MOS transistor of the first bias current source 11 is four times as wide as that of the MOS transistor in the second bias current source 13, even if there is one MOS transistor in each of the first and second bias current sources 11 and 13, the ratio of the first bias current to the second bias current is 4:1. When resistors are connected serially to the transistors having the same characteristics, respectively, and the ratio of the values of resistance of the resistors serially connected is set to 4:1, the current ratio also becomes 4:1.

The construction of the constant current source will be summarized hereinbelow.

FIGS. 3(a)–3(d) are a circuit diagram showing various constant current sources constructed by using the MOS transistors. In the diagram, R1 and R2 denote values of resistance of resistors shown, and gm1 and gm2 indicate mutual conductances of the MOS transistors.

Figure 3A:
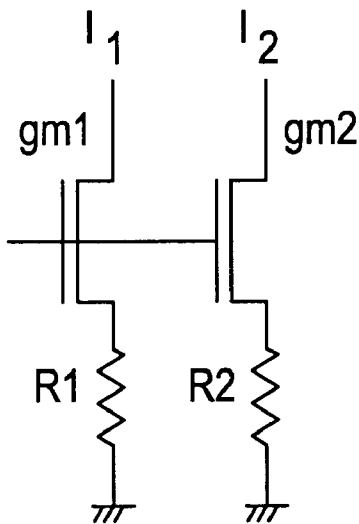
FIGS. 3(*a*) to 3(*d*) are a circuit diagram showing various constant current sources constructed by using MOS transistors.
Figure 3B:
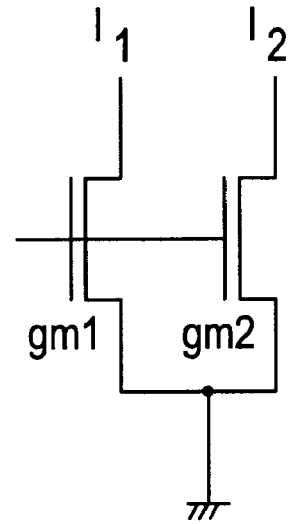
Figure 3C:
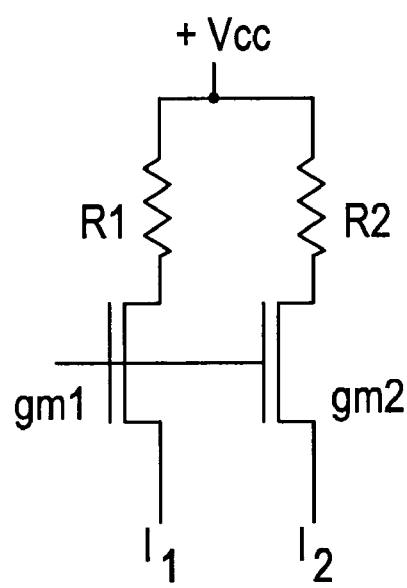
Figure 3D:
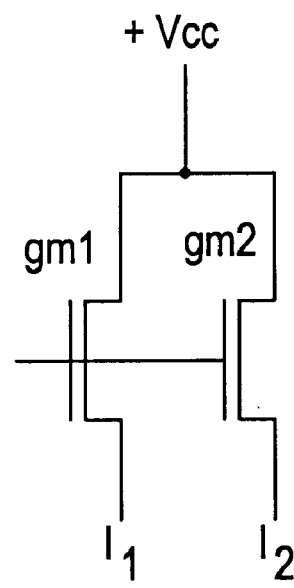

As constant current sources, there are a current sink type of sinking the current into the current source as shown in FIGS. 3(a) and (b) and a current source type of sourcing the current from the current source as shown in FIGS. 3(c) and 3(d). Whether the current sink type or the current source type is used is selected according to the laser diode used. The current source shown in FIG. 1 relates to an example of the current sink type.

The ratio $I_1:I_2$ of currents $I_1$ and $I_2$ of two current sources shown as a pair in each of FIGS. 3(a) to 3(d) is determined by the resistance ratio R1:R2 when two MOS transistors having the mutual conductance ratio gm1:gm2=R2:R1 are used in FIGS. 3(a) and 3(c). In FIGS. 3(b) and 3(d), the ratio of $I_1:I_2$ is determined by the ratio of gm1:gm2 of the conductances gm1 and gm2 of the two MOS transistors. The conductance ratio of gm1:gm2 can be also set by using transistors having different channel widths or can be also set by the ratio of the numbers of the parallelly connected transistors when transistors having the same channel width and length are connected in parallel.

By setting $I_1=4\times I_2$, the current sources of FIGS. 3(a) and 3(b) can be used as they are as first and second bias current sources shown in FIG. 1. The current sources of FIGS. 3(c) and 3(d) can be used as bias current sources which can replace the first and second bias current sources shown in FIG. 1 by being arranged on the anode 1a side of the laser diode 1. In the case of FIGS. 3(c) and 3(d), the current switch 12 shown in FIG. 1 is also arranged on the side of the anode 1a of the laser diode 1.

FIGS. 4(a) to 4(d) and 5(a) to 5(d) are circuit diagrams showing examples of constant current sources using bipolar transistors and junction transistors, respectively.

FIGS. 4(a) to 4(d) and FIGS. 5(a) to 5(d) correspond to FIGS. 3(a) to 3(d) using the MOS transistors, respectively. The operations are similar to those in the cases of FIGS. 3(a) to 3(d), so repetitive description is omitted here. In consideration of simplicity in integration and high processing speed, it is preferable to use the MOS transistors or bipolar transistors. Further, when a digital circuit and an analog circuit are mixedly used in one semiconductor integrated circuit as shown in FIG. 1, it is preferable to use the MOS transistors.

Referring again to FIG. 1, the description will be continued.

In the laser diode driving circuit shown in FIG. 1, in addition to the first and second bias current sources 11 and 13, there is also provided drive current source 14 as a current source of the drive current for the luminous intensity modulation of the laser beam radiated from the laser diode 1. The drive current source 14 is constructed in a manner similar to the first and second bias current sources 11 and 13. However, the drive current source 14 is controlled by an analog voltage outputted from a second D/A converter 17.

In FIG. 1, a photodiode 2 for detecting the light emission of the laser diode 1 is shown. A cathode 2b of the photodiode 2 is connected to the power source $V_{cc}$ and an anode 2a is connected to a resistor 18 for current-voltage conversion. A signal converted to the voltage by the resistor 18 is led to an input of the control unit 15 via an A/D converter 19. Data for controlling the first and second bias current sources 11 and 13 and the drive current source 14 for the luminous intensity modulation is sent from the control unit 15 to a latch 21 for once holding voltage values for a bias current control as digital values and to a latch 22 for once holding voltage values for a drive current control as digital values, respectively. The digital data held by the latches 21 and 22 is converted to analog data by the D/A converters 16 and 17 by timing signals obtained from the control unit 15, respectively. The analog data (analog voltages) are supplied as control voltages to the current sources 11, 13, and 14, respectively.

The operation of the embodiment shown in FIG. 1 will be described. The laser diode driving circuit 10 shown in FIG. 1 executes an APC (Automatic Power Control) operation for automatically adjusting the quantity of light of the laser beam radiated from the laser diode 1 and a recording operation for radiating the laser beam whose luminous intensity is changed according to data. The APC operation will be first described hereinbelow, and after that, the recording operation will be described.

When the APC operation is started, the control unit 15 sends data for sequentially increasing the drive current to the latch 22 via a multiplexer 20 while keeping the first and second bias currents to the current values determined in the previous APC operation. When the light quantity of the light emission of the laser diode 1 reaches a predetermined first light emission level $P_1$, the control unit 15 stores the current data at that time into an internal memory and increases the current value to a second light emission level $P_2$. When the current value reaches a second predetermined light emission level, the control unit 15 stores the current data at that time into the internal memory. Subsequently, the control unit 15 stops the current control once and resets the latches 21 and 22. The control unit 15 obtains a threshold current $I_{th}$ of the laser diode from the current control data value $I_1$ for the first light emission level $P_1$ and the current control data value $I_2$ for the second light emission level $P_2$ by using an equation (1).

$$I_{th} = I_2 - (P_2 \times I_2 - I_1)/(P_2 - P_1) \quad (1)$$
$$= (P_2 I_1 - P_1 I_2)/(P_2 - P_1)$$

Based on the result of the calculation with the equation, the control unit 15 sends digital data to the latch 21 so that the total of the bias currents flowing from the first and second bias current sources is equal to the threshold current $I_{th}$.

Consequently, the first bias current which always flows from the first bias current source 11 is normally equal to 80% of the threshold current $I_{th}$ during the operation of the laser diode 1 irrespective of the characteristics of the laser diode 1.

The control unit 15 obtains the difference of the current values per level of 64 levels from the current control data value $I_1$ for the first light emission level $P_1$ and the current control data value $I_2$ for the second light emission level $P_2$ by using an equation (2). Further, the current $I_n$ of the (n)th level (n=1, 2, . . . , 63) is calculated from the difference and the threshold current $I_{th}$ with respect to each of the 64 levels by using an equation (3) and the results are stored into the internal memory.

$$DI = (I_2 - I_1)/(P_2 - P_1) \quad (2)$$
$$I_n = I_{th} + n \times DI \quad (3)$$

For example, when the laser diode 1 is allowed to emit lights so as to modulate the luminous intensity of halftone comprising 64 grades, the current switch 12 is not turned on at the 0 level. From the 1 to 63 levels, the current switch 12 is turned on and digital data corresponding to the current value according to the level is sent to the latch 22. Consequently, the light is not emitted by the laser radiation at the 0 level, so the luminous intensity of the halftone having the 64 grades can be modulated.

Figure 8:
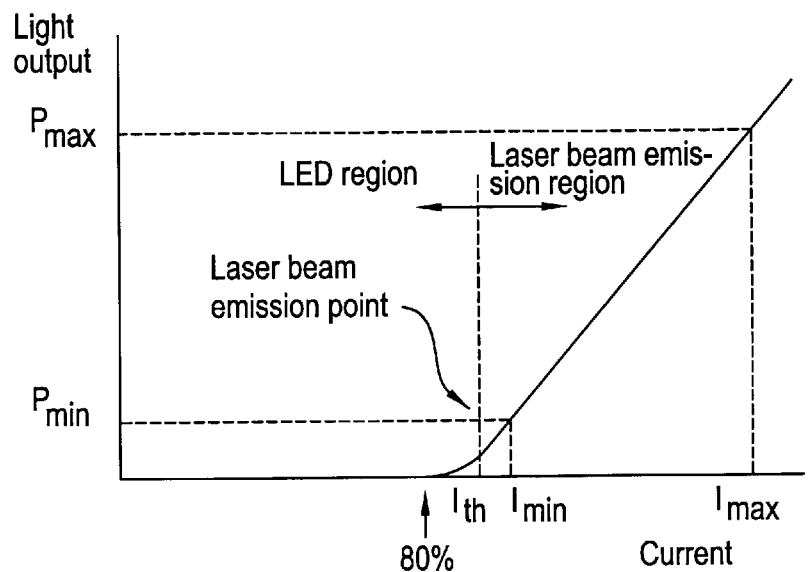
FIG. 8 is a diagram showing the light output characteristic of the laser diode.
Figure 9:
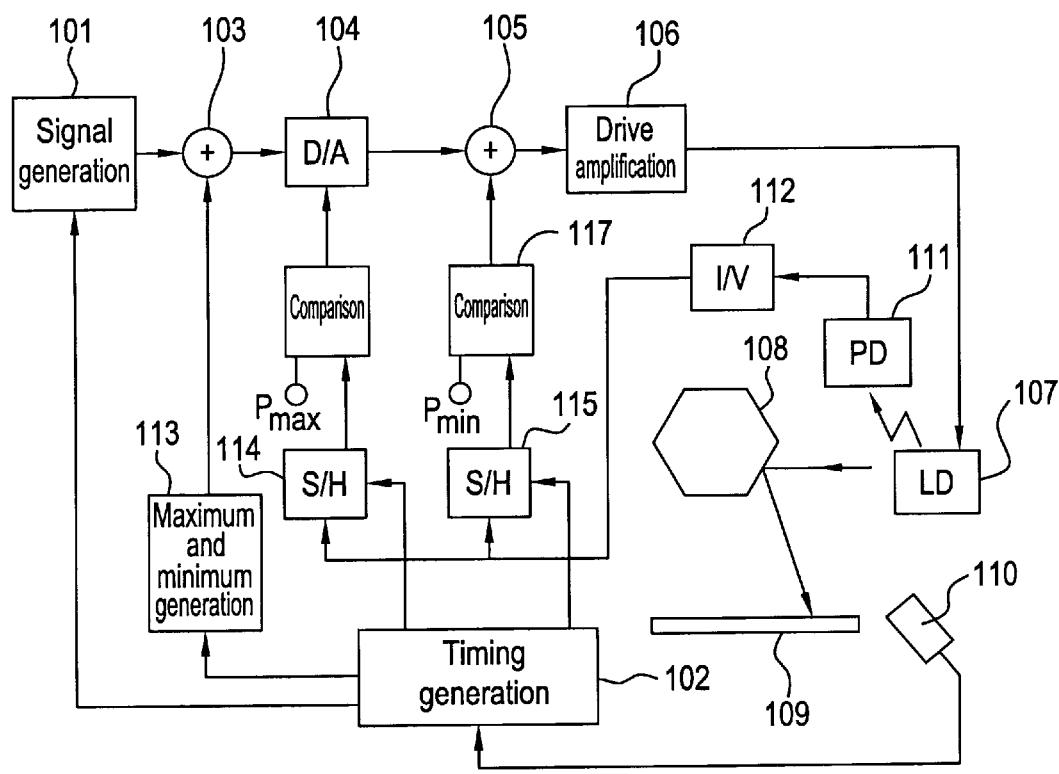
FIG. 9 is a schematic diagram showing mainly a laser diode driving circuit portion of a conventional image recording apparatus using a luminous intensity modulating system.

Although the method of obtaining the threshold current $I_{th}$ on the basis of the equation (1) and setting the total of the bias currents supplied from the first and second bias current sources 11 and 13 to the threshold current $I_{th}$ has been described as above, in place of obtaining the threshold value current $I_{th}$, the total of the bias currents supplied from the first and second bias current sources 11 and 13 may be also set to the predetermined minimum value Imin (refer to FIG. 8). This setting method will be described hereinbelow.

In order to set the minimum value Imin, the switch 12 is turned on, control signals are sent from the control unit 15 to the latch 21 which is connected to the first and second bias current sources 11 and 13 via the D/A converter 16 and the bias currents flow according to the initial state of the latch 21 from the first and second bias current sources 11 and 13 into the laser diode 1. The laser diode 1 emits a light of the quantity according to the bias current, a monitor current is generated from the photodiode 2, a voltage value converted by the current-voltage converting circuit 18 is A/D converted, and the converted value is inputted to the control unit 15. The A/D converted voltage value is compared with a set value Vref1 at the minimum level stored in the internal memory and the digital value determining the bias current to/from which an amount corresponding to an error is added or subtracted is supplied to the latch 21. The operation is repeated until the light emission of the laser diode 1 becomes stable, thereby setting the minimum level.

The maximum level will be set next.

The switch 12 is turned on, the latches 21 and 22 are simultaneously operated by the control unit 15 and the total current of the bias current according to the minimum level and the drive current according to the initial state of the latch 22 is allowed to flow in the laser diode 1. The laser diode 1 emits a light of a quantity according to the total current of the bias current and the drive current, a monitor current is generated from the photodiode 2, the voltage value converted by the current-voltage converting circuit 18 is A/D converted, and the converted value is supplied to the control unit 15. The inputted voltage value is compared with a set value Vref2 of the maximum level stored in the internal memory, and a digital value which determines the drive current, to/from which an amount corresponding to an error is added or subtracted, is sent to the latch 22. The operation is repeated to determine the maximum level of the current.

In the APC operation, the total of the bias currents flowing from the first and second bias current sources 11 and 13 is set to the minimum current Imin which makes a state of a minimum laser beam radiation which is slightly larger than the threshold current $I_{th}$ of the laser diode 1.

The recording operation will be described next.

As mentioned above, since the ratio of the first bias current to the second bias current is set to 4:1, in the state where the switch 12 is turned off, only the first bias current flows in the laser diode 1. Thus, the laser diode 1 does not certainly emit lights. For example, when the luminous intensity of the halftone having the 64 grades is modulated by using the laser diode 1, the digital value corresponding to the voltage set by the APC is held in the latch 21, the digital value is always D/A converted and outputted to the first and second bias current sources 11 and 13. The digital values corresponding to the data sent from the control unit 15 are also held in the latch 22 every recording data. After D/A converting the digital values, the resultant values are supplied to the drive current source 14.

At the 0 level which is the lowest level in the 64 gradations, a command to output the digital value corresponding to the threshold current $I_{th}$ or the minimum current Imin set in the APC operation and stored in the latch 21 is sent from the control unit 15 to the first and second bias current sources 11 and 13 via the DA converter 16. The current switch 12 remains to be off at this time. Eighty percent of the total of the bias currents, that is, 80% of the threshold current $I_{th}$ or the minimum current Imin flows in the laser diode 1 and the laser diode 1 does not emit a light.

At the 1st to 63rd levels, the digital values according to the levels are sent from the control unit 15 to the latch 22 and are held. The drive current source 14 is controlled via the D/A converter 17 so as to be the current value corresponding to the level. The digital values corresponding to the bias currents are held in the latch 21 and predetermined bias currents are outputted via the D/A converter 16 from the first and second bias current sources 11 and 13. At this time, the current switch 12 is turned on. Consequently, the bias current equal to the threshold current $I_{th}$ or the minimum current Imin and the drive current of the current value corresponding to each data flow in the laser diode 1.

By the above operations, the light emission due to the laser is certainly prevented at the 0 level and the luminous intensity of the halftone having the 64 gradations can be accurately modulated.

Figure 6:
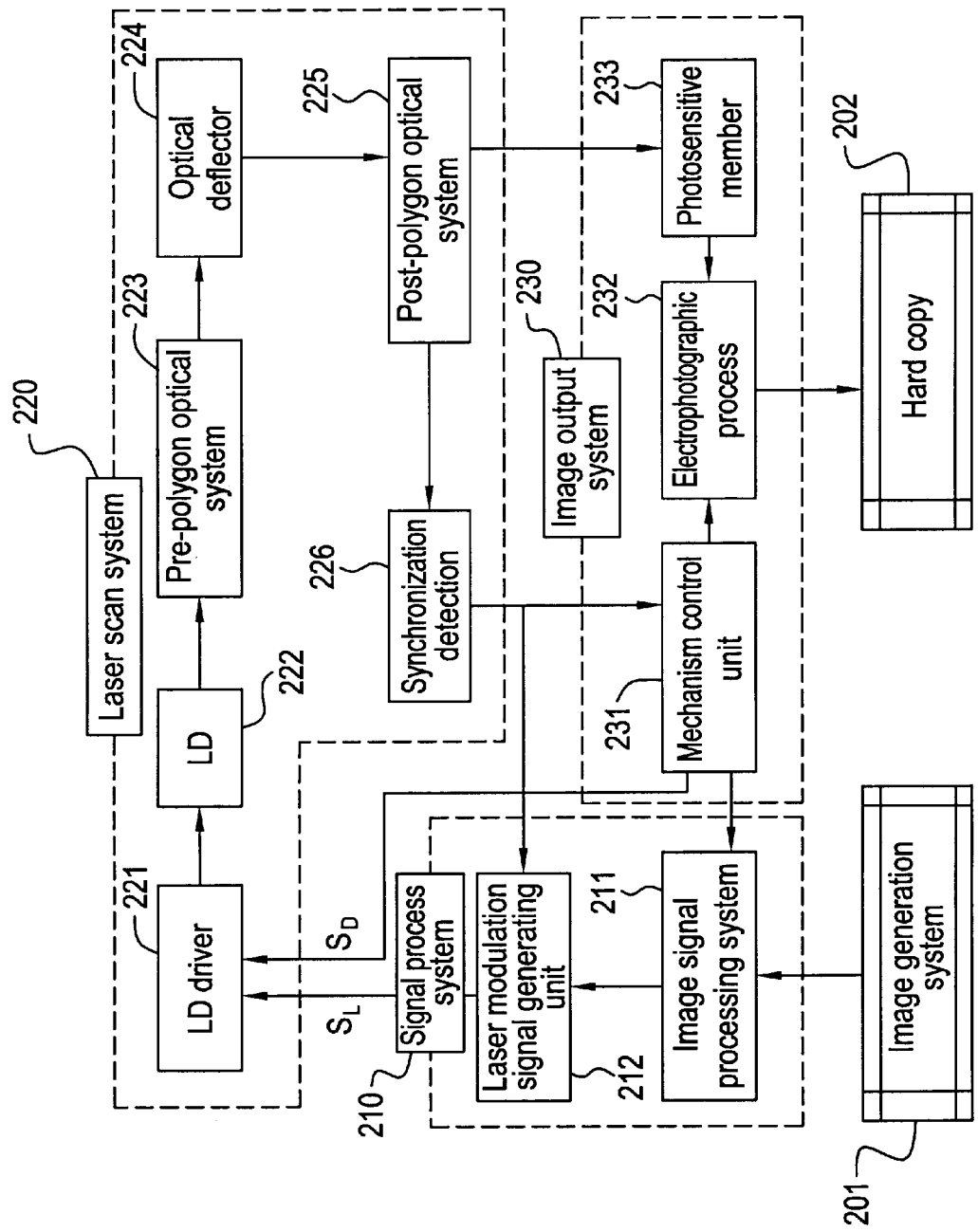
FIG. 6 is a block diagram showing an embodiment of an image recording apparatus of the invention.
Figure 7:
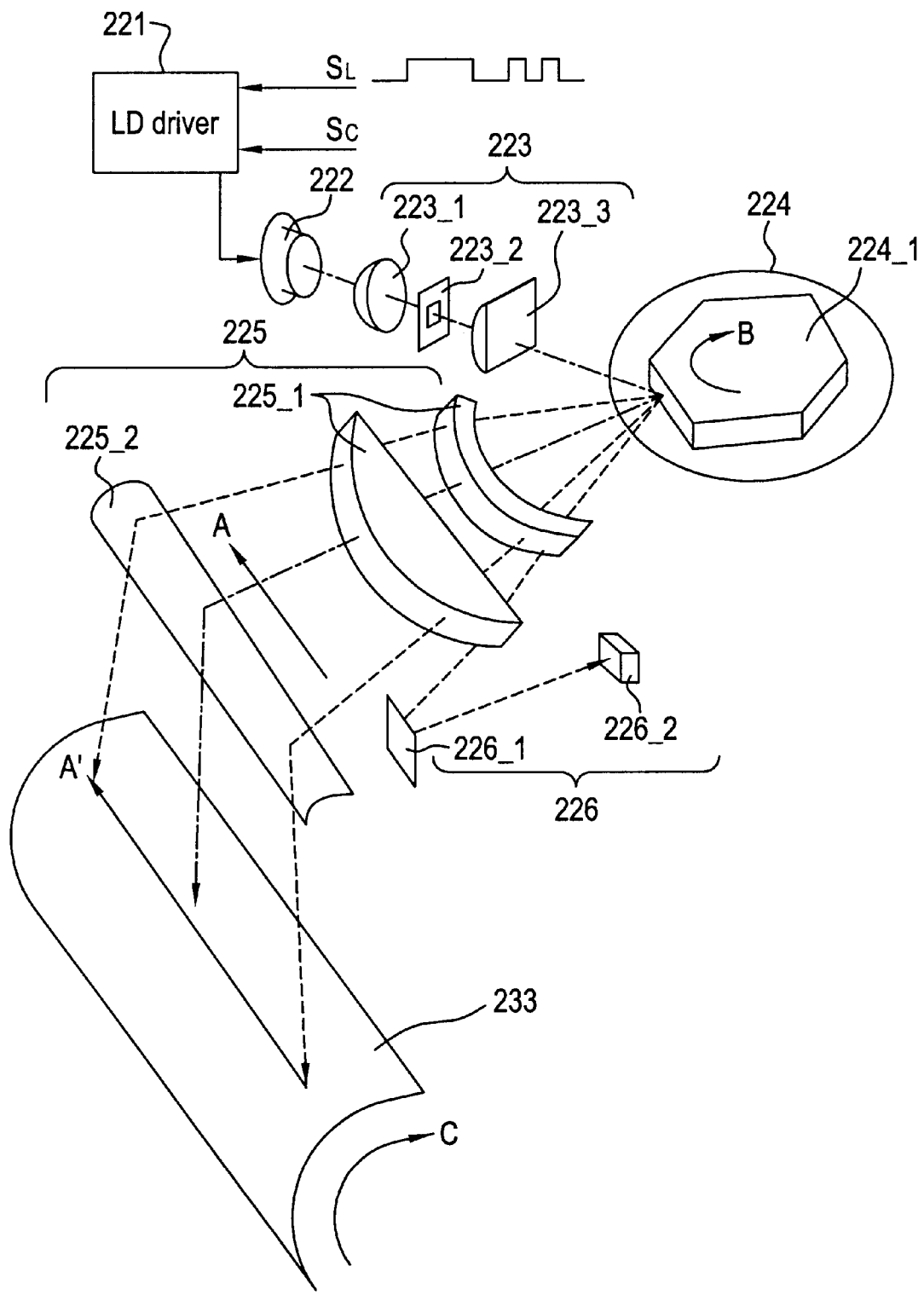
FIG. 7 is a diagram illustrating the construction of a laser scan system of the image recording apparatus shown in FIG. 6.

FIG. 6 is a block diagram showing an embodiment of an image recording apparatus of the invention. FIG. 7 is a diagram illustrating the construction of a laser beam scanning system of the image recording apparatus shown in FIG. 6.

The construction of the image recording apparatus shown in FIG. 6 is roughly divided into a signal processing system 210, a laser beam scanning system 220, and an image outputting system 230. When image signals obtained by an image forming system 201 such as a digital scanner for reading an image and obtaining image signals are supplied to an image signal processing system 211 as a component of the signal processing system 210, in the image processing system 211, control information from a mechanism control unit 231 for controlling the mechanism of an electrophotographic process 232 as a part of the image outputting system 230, for example, information of developing conditions is received, proper image processes, for instance, a gradation process, a color compensating process, and the like are performed to the inputted image signals so as to adapt to the information, and the processed image signals are supplied to a laser beam modulation signal generating unit 212. The laser beam modulation signal generating unit 212 generates a laser modulation signal expressing the luminous intensity of the laser beam radiated from a laser diode 222 as a component of the laser scanning system 220 on the basis of the inputted image signal. By receiving information from a synchronization detecting means 226 of the scanning laser beam as a component of the laser beam scanning system 220, the laser modulation signal is generated synchronously with the laser beam scan. According to the embodiment, the synchronization detecting means 226 of the scan laser beam is constructed by a mirror 226_1 and an optical sensor 226_2 as shown in FIG. 7. A sync pulse is outputted from the optical sensor 226_2 each time the laser beam radiated from the laser diode 222 is deflected once in the direction of the arrow A shown in FIG. 7.

A laser beam modulation signal $S_L$ generated by the laser beam modulation signal generating unit 212 shown in FIG. 6 is inputted to an LD driver 221 as a component of the laser scanning system 220. Mechanism control information $S_C$ from the mechanism control unit 231 is also supplied to the LD driver 221. The LD driver 221 drives the laser diode (LD) 222 in accordance with the mechanism control information SC. The laser diode 222 radiates the laser beams with time sequential intensity modulation by the driving of the LD driver 221. The radiated laser beams pass through a pre-polygon optical system 223 comprising a lens 223_1, an aperture 223_2, and a cylindrical lens 223_3 and are repeatedly deflected in the direction of the arrow A by an optical deflector 224 including a polygon mirror 224_1 rotating in the direction of the arrow B. Further, the laser beams pass through a post-polygon optical system 225 comprising an fq lens 225_1 and a cylindrical mirror 225_2 and repeatedly executes scanning (main scan) or a photosensitive member 233 rotating in the direction of the arrow C as a composite of the image outputting system 230 in the direction of the arrow A'.

The photosensitive member 232 has characteristics that resistance values on the surface are changed by the irradiation of the lights, so that by being scanned with the laser beams having image information, an electrostatic latent image is formed on the surface. The electrostatic latent image formed on the photosensitive member 233 is subjected to the predetermined electrophotographic process 232, thereby forming a hard copy 202 of the image carried by the image signals obtained by the image forming system 201 on a predetermined sheet.

The LD driver 221 in the image recording apparatus according to the embodiment includes the laser diode driving circuit having the construction described with reference to FIG. 1. Consequently, in the image recording apparatus, the laser diode 222 is certainly kept in the no light emitting state at the timings when the no light emitting state has to be kept and the laser beams whose light quantities are very accurately adjusted are obtained at timings when the laser diode 222 should be allowed to emit lights. Thus, a high-picture quality image can be formed.

According to the invention as mentioned above, the no light emitting state of the laser diode can be certainly kept while flowing the bias current to the laser diode and the output laser beam of the light quantity which is adjusted with high accuracy can be obtained.

The invention relates to the method in which a plurality of bias current sources are provided and one of them is always turned on. The bias current can be controlled easily as compared with a method in which only one bias current source is provided and a bias current supplied from the bias current source is switched, for example, between 80% and 100%.

What is claimed is:

1. A laser diode driving circuit for supplying a bias current and a drive current to a laser diode, comprising:

a first bias current source for supplying a first bias current which is set to a current value less than a light emission threshold of the laser diode to the laser diode;

a second bias current source for supplying a second bias current which is the difference between a total bias current and the first bias current to the laser diode so that a laser beam of a light quantity corresponding to the drive current is emitted from the laser diode when a current obtained by adding the drive current to the total bias current of the first and second bias currents is supplied to the laser diode;

a drive current source for supplying the drive current to the laser diode; and a current supply control circuit for supplying the first bias current to the laser diode irrespective of whether the laser diode is allowed to emit a light or not, and in a state where the first bias current is supplied, either supplying both of the second bias current and the drive current to the laser diode or stopping the supply of both of the second bias current and the drive current to the laser diode in accordance with whether the laser diode is allowed to emit a light or not.

2. The laser diode driving circuit according to claim 1, wherein all of the first bias current source, the second bias current source, and the drive current source are constant current sources.

3. The laser diode driving circuit according to claim 1, wherein in the first bias current source and the second bias current source, the first and second bias currents are determined so that the first bias current is larger than the second bias current.

4. A laser diode driving circuit for supplying a bias current and a drive current to a laser diode, comprising:

a plurality of bias current sources for supplying bias currents to the laser diode so that when a current obtained by adding the drive current to a total bias current is supplied to the laser diode, a laser beam of the light quantity according to the drive current is radiated from the laser diode;

a drive current source for supplying the drive current to the laser diode; and a switching circuit which is arranged between the laser diode and both of the bias current source as a part of the plurality of bias current sources and the drive current source and connects and disconnects the laser diode to the part of the bias current sources and simultaneously to the drive current source in accordance with a predetermined control signal.

5. A semiconductor integrated circuit for driving a laser diode, which supplies a bias current and a drive current to the laser diode, comprising:

a first bias current source for supplying a first bias current which is set to a current value less than a light emission threshold of the laser diode to the laser diode;

a second bias current source for supplying a second bias current which is the difference between a total bias current and the first bias current to the laser diode so that a laser beam of a light quantity corresponding to the drive current is emitted from the laser diode when a current obtained by adding the drive current to the total bias current of the first and second bias currents is supplied to the laser diode;

a drive current source for supplying the drive current to the laser diode; and a switching circuit for switching, in accordance with a predetermined control signal, a state in which all of the first bias current, the second bias current, and the drive current are supplied to the laser diode and a state in which only the first bias current out of the first bias current, the second bias current, and the drive current is supplied to the laser diode.

6. An image recording apparatus in which a step of executing a scanning on a predetermined member to be scanned with a laser beam holding image information is included in a step of recording an image, the apparatus comprising:

a laser diode for emitting a laser beam;

a laser diode driving unit for supplying a bias current and a drive current to the laser diode; and a scan optical system for executing a scanning on the predetermined member to be scanned with the laser beam emitted from the laser diode, and the laser diode driving unit including:

a first bias current source for supplying a first bias current which is set to a current value less than a light emission threshold of the laser diode to the laser diode;

a second bias current source for supplying a second bias current which is the difference between a total bias current and the first bias current to the laser diode so that a laser beam of a light quantity corresponding to the drive current is emitted from the laser diode when a current obtained by adding the drive current to the total bias current of the first and second bias currents is supplied to the laser diode;

a drive current source for supplying the drive current to the laser diode; and a switching circuit for switching, in accordance with an image signal holding image information, a state in which all of the first bias current, the second bias current, and the drive current are supplied to the laser diode and a state in which only the first bias current out of the first bias current, the second bias current, and the drive current is supplied to the laser diode.

* * * * *